(12) United States Patent
Chen et al.

(10) Patent No.: US 8,761,388 B2
(45) Date of Patent: Jun. 24, 2014

(54) ELECTRONIC DEVICE CASE WITH WATER RESISTANT SIDE BUTTON

(71) Applicants: Universal Scientific Industrial (Shanghai) Co., Ltd., Shanghai (CN); Universal Global Scientific Industrial Co., Ltd., Nantou County (TW)

(72) Inventors: Shih-Yen Chen, Nantou County (TW); Chia-Hao Shih, Nantou County (TW); Ching-Yung Hu, Nantou County (TW); Tzu-Ming Su, Nantou County (TW)

(73) Assignees: Universal Scientific Industrial (Shanghai) Co., Ltd., Shanghai (CN); Universal Global Scientific Industrial Co., Ltd., Nantou County (TW)

( * ) Notice: Subject to any disclaimer, the term of this patent is extended or adjusted under 35 U.S.C. 154(b) by 0 days.

(21) Appl. No.: 13/782,507

(22) Filed: Mar. 1, 2013

(65) Prior Publication Data
US 2014/0145570 A1    May 29, 2014

(30) Foreign Application Priority Data
Nov. 23, 2012  (TW) .............................. 101143993 A

(51) Int. Cl.
  *H04M 1/02*    (2006.01)
  *H04M 1/03*    (2006.01)
(52) U.S. Cl.
  CPC .............. *H04M 1/0202* (2013.01); *H04M 1/03* (2013.01)
  USPC .................... 379/433.01; 379/437; 455/575.8
(58) Field of Classification Search
  USPC .......... 379/428.01, 433.01, 433.06, 437, 451; 455/575.1, 575.8; 361/679.55, 679.56; 200/302.2; 206/320, 811; D14/137, D14/138 R, 138 AA
  See application file for complete search history.

(56) References Cited

U.S. PATENT DOCUMENTS

| | | | |
|---|---|---|---|
| 5,258,592 A * | 11/1993 | Nishikawa et al. | 200/302.2 |
| 6,512,827 B1 * | 1/2003 | Kitamura | 379/433.01 |
| 7,050,292 B2 * | 5/2006 | Shimura et al. | 361/679.01 |
| 7,964,811 B2 * | 6/2011 | Lin et al. | 200/302.2 |

* cited by examiner

*Primary Examiner* — Tuan D Nguyen
(74) *Attorney, Agent, or Firm* — Muncy, Geissler, Olds & Lowe, P.C.

(57) ABSTRACT

An electronic device case includes a first shell, a second shell, and a side button. The first and second shells are each provided with a peripheral side plate. A passage communicating the inside and outside of the case, a first restriction slot extending from the passage toward the first shell, and a second restriction slot extending from the passage toward the second shell are formed jointly by the peripheral side plates of the shells embedded with each other. The side button is provided with a base and a press portion protruding from the base. The thickness of the base is larger than or equal to the widths of the restriction slots. The side button is installed in the passage with the base embedded in the restriction slots. As a result, the case is sufficiently water resistant, firm in structure and easy to assemble.

10 Claims, 10 Drawing Sheets

US 8,761,388 B2

ELECTRONIC DEVICE CASE WITH WATER RESISTANT SIDE BUTTON

BACKGROUND OF THE INVENTION

1. Field of the Invention

The present invention relates generally to electronic device cases, such as mobile phone cases having side buttons, and more particularly, to an electronic device case with a water resistant side button.

2. Description of the Related Art

The commercially available electronic devices, especially portable electronic devices, usually have a case formed with two shells which are fitted together at their peripheral side edges. The juncture of the shells usually has an opening for installment of a side button, such as a volume control button or a camera shutter button. The conventional side button is stuck on the shells by means of double-sided adhesive tape, which is inconvenient and time-consuming in assembly of the case and liable to cause imperfection in adhesion of the side button. Besides, the effect of double-sided adhesive tape for fastening the side button may not last for long time. Furthermore, the opening of the case allows water to enter the case, which is liable to damage the circuits in the electronic device.

Therefore, the water resistant side buttons are developed, such as that disclosed in U.S. Pat. No. 5,258,592. In aforesaid patent, the shells are both provided with a recess at their juncture and the side button is embedded in the recesses so as to be fixed between the shells. In this way, the side button can avoid being stuck imperfectly and is somewhat water resistant; however, the side button is still not good enough in water resistant effect, inconvenient to assemble and not firm enough in structure.

SUMMARY OF THE INVENTION

The present invention has been accomplished in view of the above-noted circumstances. It is an objective of the present invention to provide an electronic device case with a water resistant side button, which is sufficiently water resistant, firm in structure and easy to assemble.

To attain the above objective, the present invention provides an electronic device case, which comprises a first shell, a second shell and a side button. The first shell and the second shell are each provided with a main plate and a peripheral side plate encircling the main plate. The peripheral side plate of the first shell has an installment portion which has an outer sheet and an inner sheet. The inner sheet of the first shell is embedded in the peripheral side plate of the second shell in such a way that a passage communicating an outside and an inside of the case, a first restriction slot extending from the passage toward the first shell, and a second restriction slot extending from the passage toward the second shell are formed by the installment portion of the first shell and the peripheral side plate of the second shell jointly. The side button is provided with a base and a press portion protruding from the base. The thickness of the base is larger than or equal to the widths of the first and second restriction slots. The side button is installed in the passage with the base embedded in the first and second restriction slots.

As a result, the base of the side button is embedded in the first and second restriction slots tightly, which can prevent the water outside the case from passing the passage and entering the case and make the side button be installed at the first and second shells very firmly. In this way, the side button of the electronic device case is sufficiently water resistant and firm in structure. Besides, when the case is assembled, the installment of the side button is carried out only by embedding the base in the first and second restriction slots in order, which needs not to align the side button deliberately and is not easy to cause misinstallation. This means the electronic device case is very easy to assemble.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
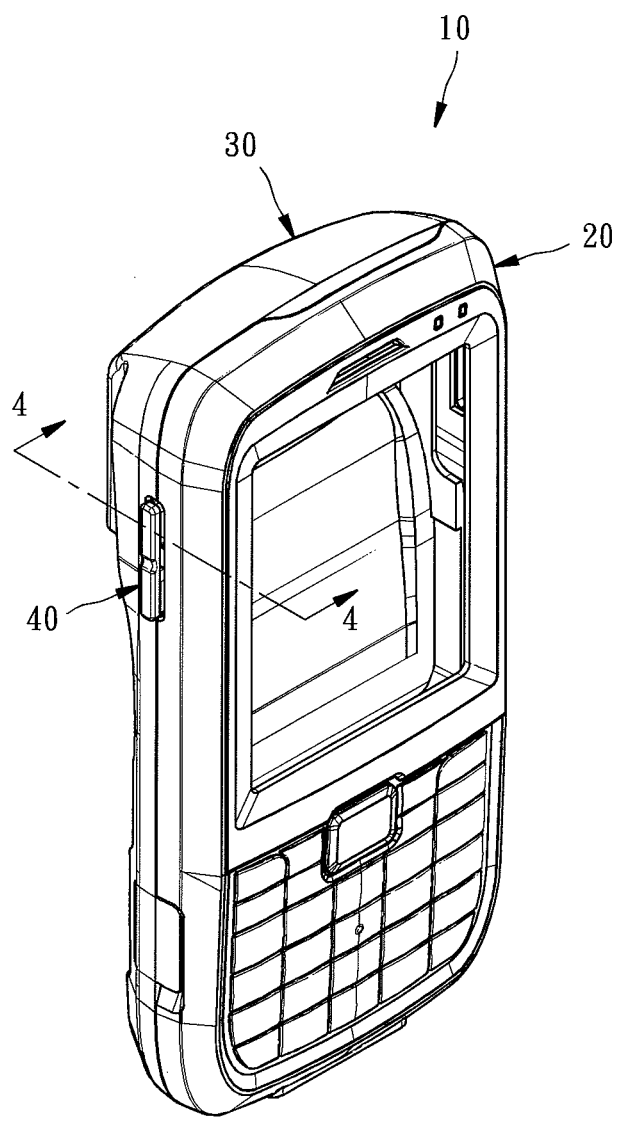
FIG. 1 is an assembled perspective view of an electronic device case provided by a preferred embodiment of the present invention.
Figure 2:
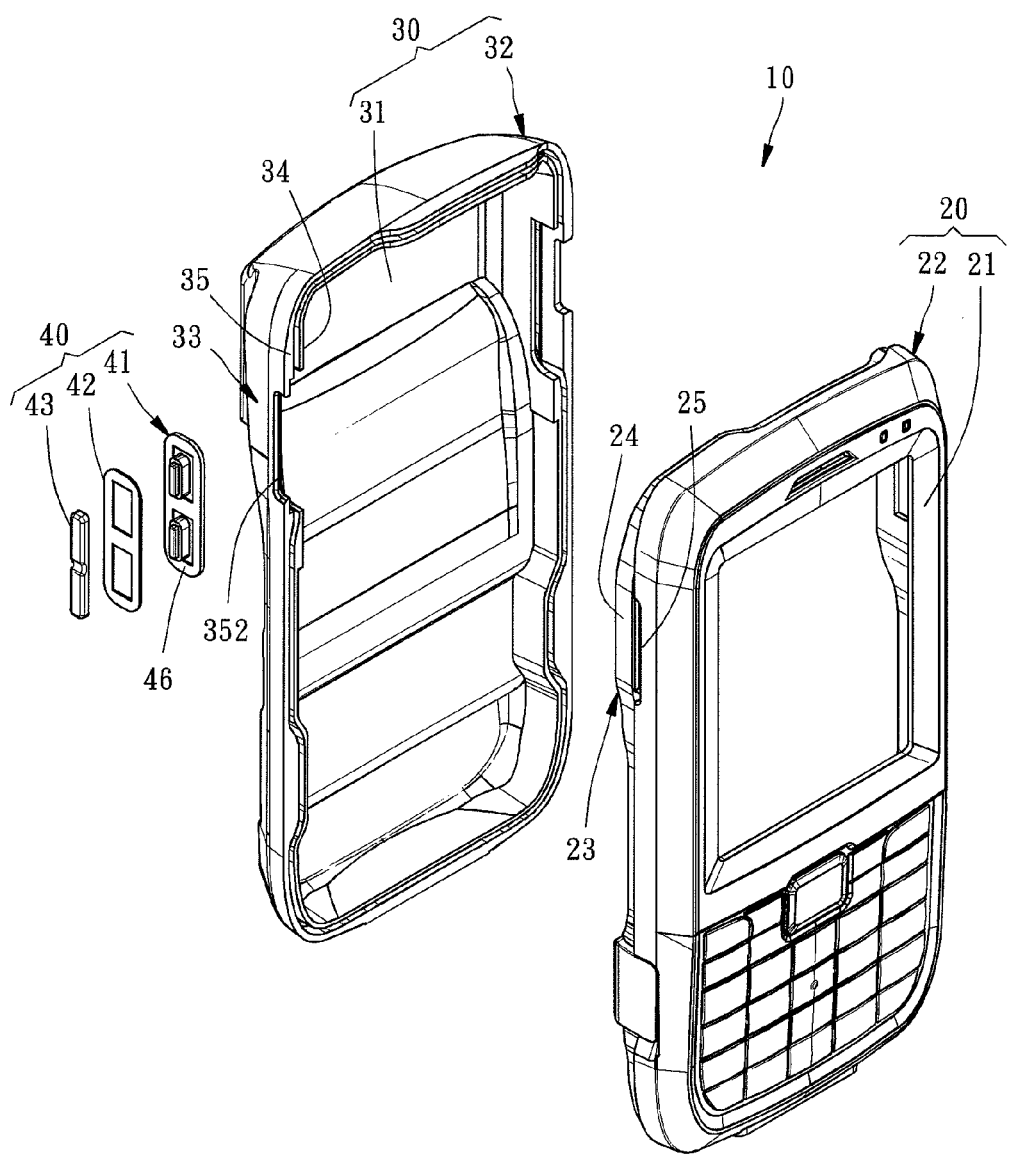
FIG. 2 is an exploded perspective view of the electronic device case provided by the preferred embodiment of the present invention.

Referring to FIGS. 1-2, an electronic device case 10, which is provided by a preferred embodiment of the present invention, comprises a first shell 20, a second shell 30, and a side button 40. In this embodiment, the electronic device case 10 is exemplified as a mobile phone case. However, the mobile phone case is just an example of the electronic device case 10. The features to be illustrated below are all able to be applied in other kinds of electronic device cases.

Figure 3:
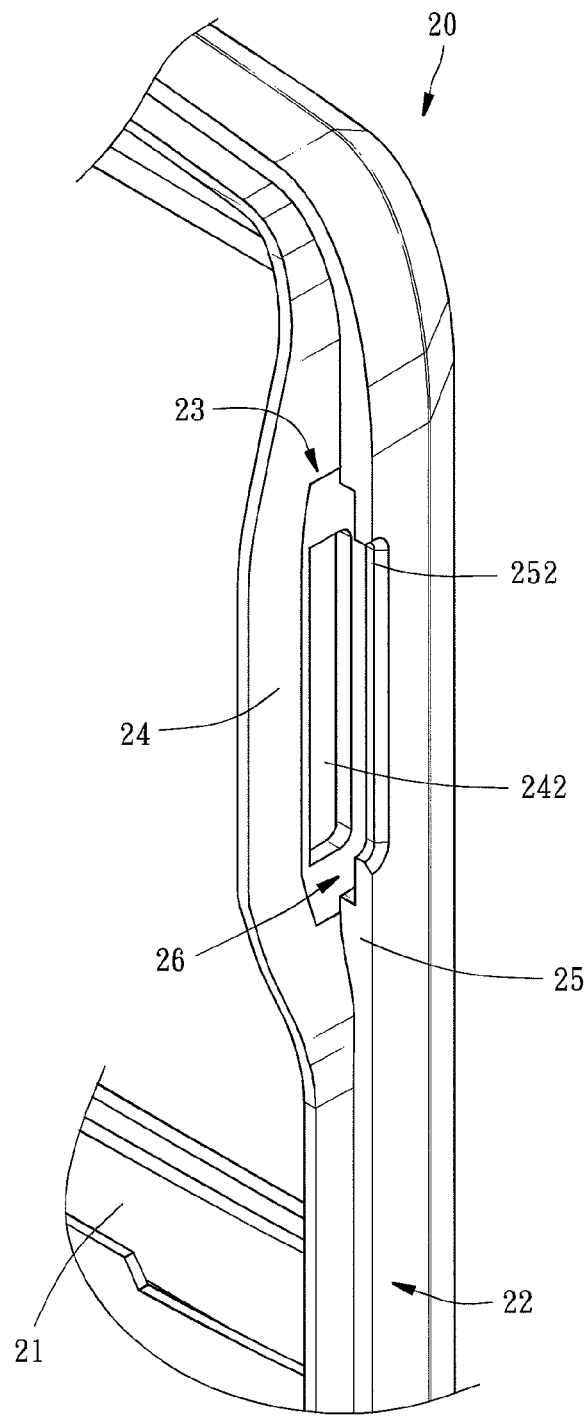
FIG. 3 is a partial perspective view of a first shell of the electronic device case provided by the preferred embodiment of the present invention.
Figure 4:
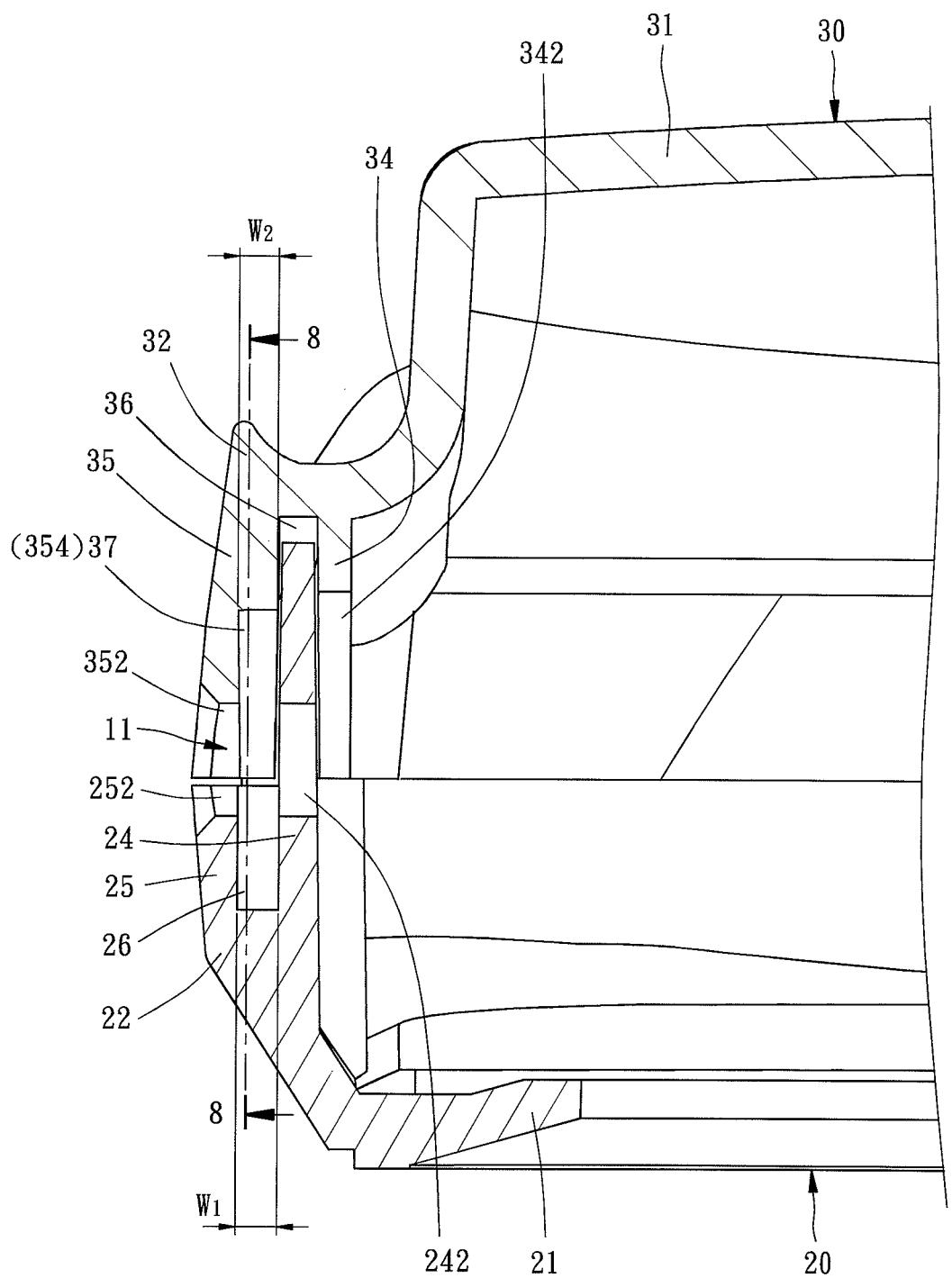
FIG. 4 is a sectional view taking along line 4-4 in FIG. 1, wherein a side button of the electronic device case is not shown for the convenience of illustration.

Referring to FIGS. 2-4, the first shell 20 is integrally made from plastics and provided with a main plate 21 where the front surface of the mobile phone is located and a peripheral side plate 22 encircling the main plate 21. The peripheral side plate 22 has an installment portion 23 for installing the side button 40 therein. The installment portion 23 has an outer sheet 25, an inner sheet 24 extending over the edge of the outer sheet 25, and a first restriction slot 26 located between the inner and outer sheets 24, 25. The outer sheet 25 is provided with a recess 252 and the inner sheet 24 is provided with a hole 242 corresponding in location to the recess 252.

Figure 5:
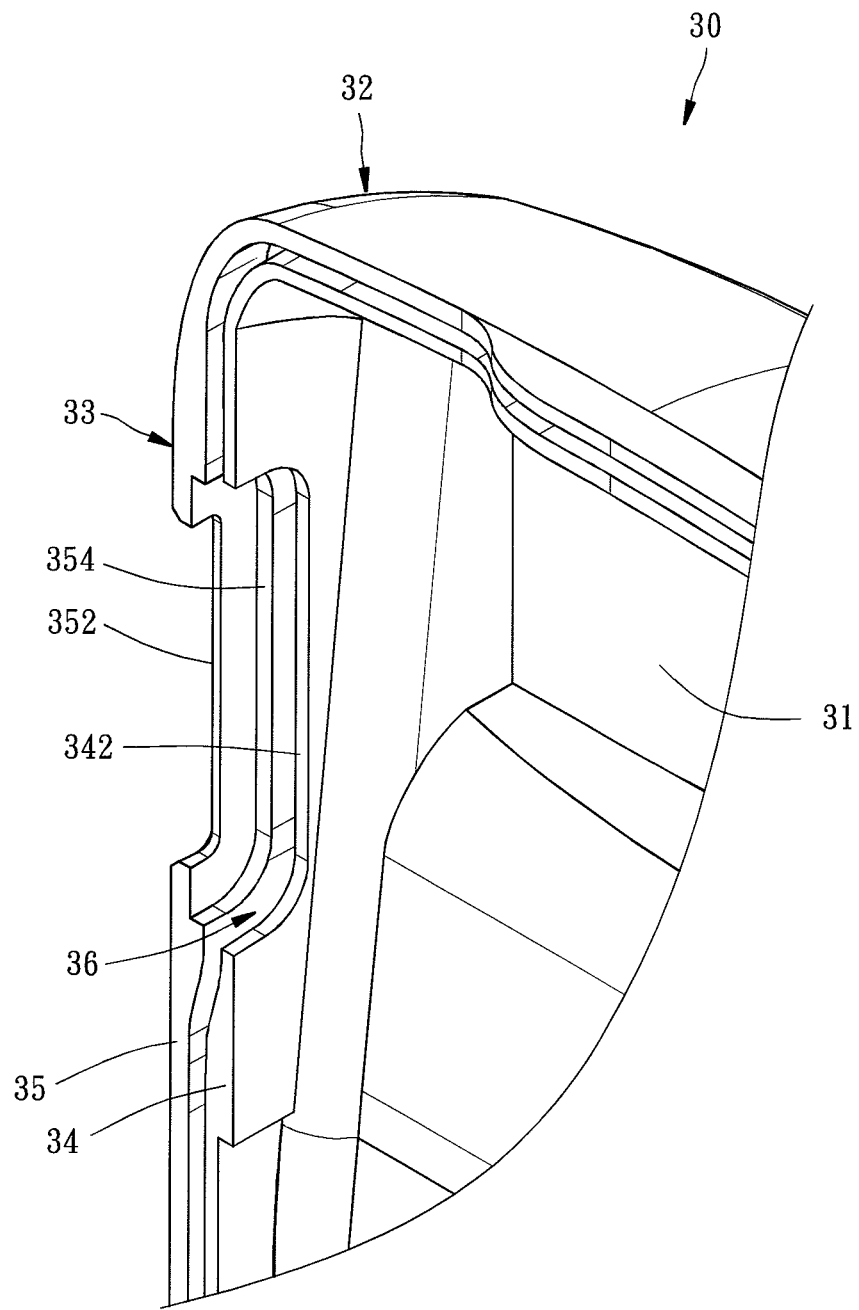
FIG. 5 is a partial perspective view of a second shell of the electronic device case provided by the preferred embodiment of the present invention.

Referring to FIG. 2 and FIGS. 4-5, the second shell 30 is integrally made from plastics and provided with a main plate 31 where the back surface of the mobile phone is located and a peripheral side plate 32 encircling the main plate 31. The peripheral side plate 32 has an installment portion 33 for installing the side button 40 therein. The installment portion 33 has an inner sheet 34, an outer sheet 35, and an embedment groove 36 located between the inner and outer sheets 34, 35. The outer sheet 35 is provided with an outer recess 352 and an inner recess 354, which are connected to become ladder-shaped. The embedment groove 36 and the inner recess 354 are connected to become ladder-shaped, as shown in FIG. 4.

Figure 6:
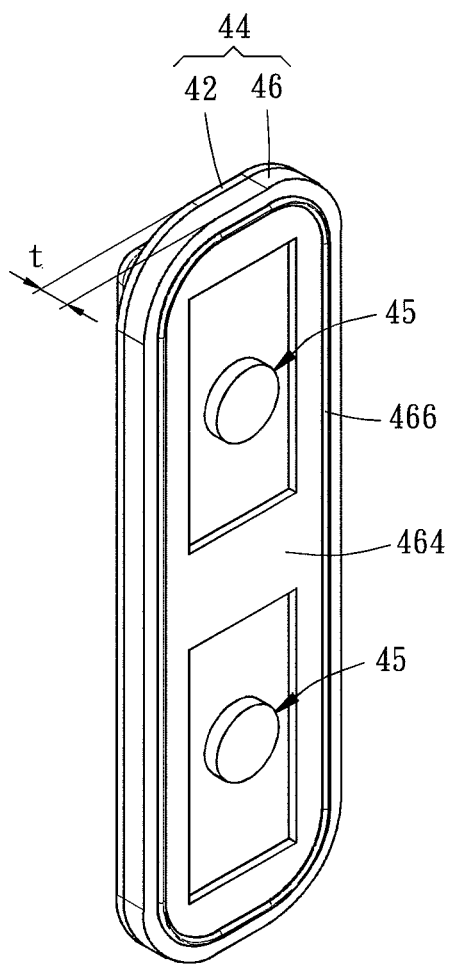
FIG. 6 is an assembled perspective view of the side button of the electronic device case provided by the preferred embodiment of the present invention.
Figure 7:
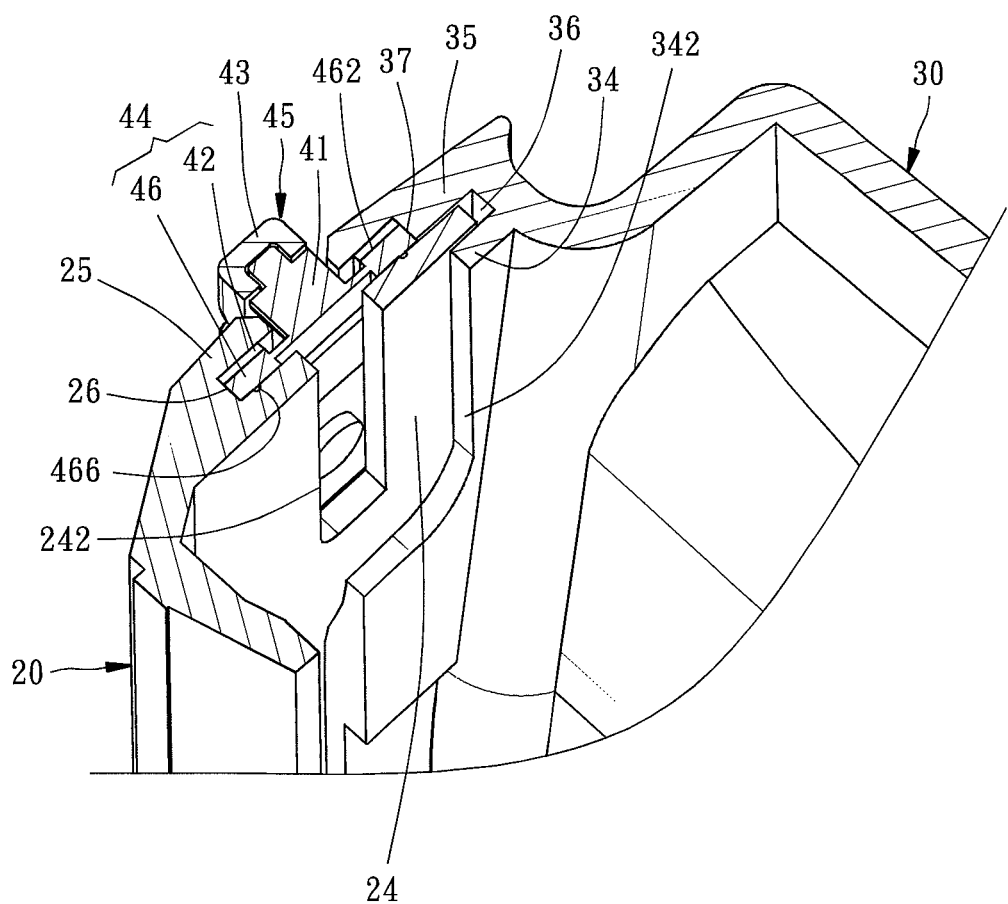
FIG. 7 is a sectional perspective view taking along line 4-4 in FIG. 1.

Referring to FIG. 2 and FIGS. 6-7, the side button 40 includes a main body 41, a reinforcement plate 42, and a cap 43. The main body 41 is made from elastic materials, e.g. rubber. The reinforcement plate 42 can be made from, but not limited to, metals as long as the reinforcement plate 42 has high rigidity. The cap 43 is made from plastics. As shown in FIG. 6, after the side button 40 is assembled, it has a base 44 and two press portions 45 protruding from the base 44. The base 44 has a plate-shaped base body 46 which is a part of the main body 41 and the reinforcement plate 42 piled on an outer surface 462 of the base body 46. The thickness t of the base 44 is the sum of the thicknesses of the base body 46 and the reinforcement plate 42. The press portions 45 are formed by the other parts of the main body 41 and the cap 43.

The case 10 is assembled by embedding a part of the base 44 of the side button 40 in the first restriction slot 26 of the first shell 20 at first and then inserting the inner sheet 24 of the first shell 20 into the embedment groove 36 of the second shell 30 to make another part of the base 44 embedded in a second restriction slot 37 which is formed by the inner recess 354 and the inner sheet 24. At the same time, the peripheral side plates 22, 32 of the first and second shells 20, 30 are embedded with each other.

Specifically speaking, referring to FIG. 4 and FIG. 7, when the shells 20, 30 are embedded with each other, a passage 11 communicating the inside and the outside of the case 10 is formed by the recess 252 and the hole 242 of the first shell 20 and the outer recess 352 of the second shell 30 jointly. The first restriction slot 26 extends from the passage 11 toward the first shell 20 and the second restriction slot 37 extends from the passage 11 toward the second shell 30. The thickness t of the base 44 of the side button 40 is larger than or equal to the width $w_1$ of the first restriction slot 26 and the width $w_2$ of the second restriction slot 37. The side button 40 is installed in the passage 11 with the base 44 embedded in the first and second restriction slots 26, 37 very tightly by a little elastic compression thereof.

As a result, the base 44 of the side button 40 can prevent the water outside the case 10 from passing the passage 11 and entering the case 10 and is installed at the first and second shells 20, 30 very firmly. In this way, the side button 40 of the electronic device case 10 is sufficiently water resistant and strong in structure. Besides, when the case 10 is assembled, the installment of the side button 40 is carried out only by embedding the base 44 in the first and second restriction slots 26, 37 in order, which needs not to align the side button 40 deliberately and is not easy to cause misinstallation. This means the electronic device case 10 is very easy to assemble.

It will be appreciated that the second restriction slot 37 is not limited to be formed by the inner sheet 24 of the first shell 20 inserting into the embedment groove 36, but can be provided in the second shell 30 itself and tightly attached to the inner and outer surfaces of the base 44 of the side button 40. However, the design provided in this embodiment, that the second restriction slot 37 is formed when the shells 20, 30 are embedded with each other, can make any one of the first and second shells 20, 30 and the side button 40 be embedded with the others, which enhances the structure strength and water resistant effect of the case 10.

In this embodiment, the reinforcement plate 42 of the side button 40 can not only strengthen the side button 40 but also prevent the problem that the base 44 is too flexible to be embedded in the restriction slots 26, 37. However, the side button 40 can also be provided with no such reinforcement plate 42; in that case, the thickness of the base body 46 should be increased to be larger than or equal to the widths $w_1$, $w_2$ of the restriction slots 26, 37. Besides, as shown in FIGS. 6-7, the base body 46 of the base 44 has an inner surface 464 and a water resistant ring 466 integrally protruding from the inner surface 464, and the water resistant ring 466 is embedded in the first and second restriction slots 26, 37. In this way, even if there is water entering the gap between the base 44 of the side button 40 and the shells 20, 30, the water resistant ring 466 can stop the water from entering deep inside of the case 10. However, the base 44 of the side button 40 can also be provided with no such water resistant ring 466. In this embodiment, the reinforcement plate 42 is piled on the outer surface 462 of the base body 46, which is facing the outside of the case 10; the water resistant ring 466 is located on the inner surface 464 of the base body 46, which is facing the inside of the case 10. However, the reinforcement plate 42 and the water resistant ring 466 can also be configured to be located on the inner surface 464 and the outer surfaces 462 respectively.

Figure 8:
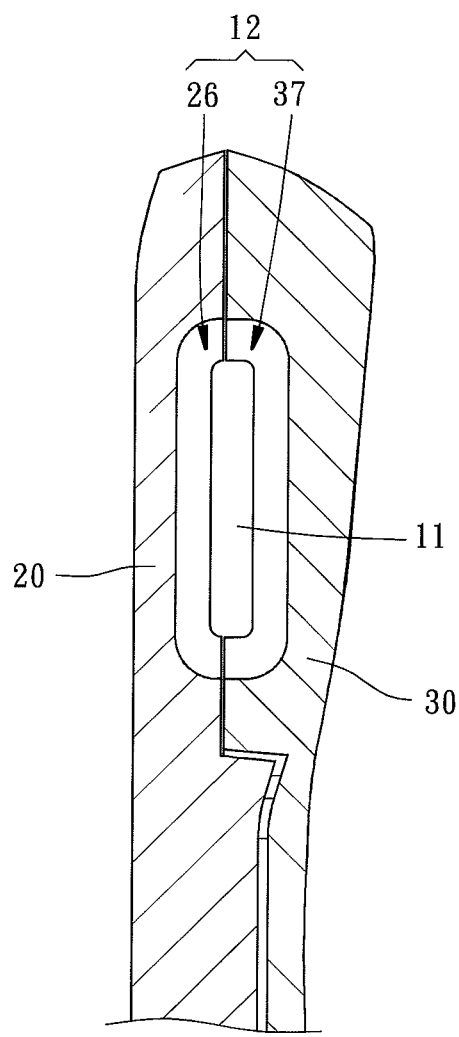
FIG. 8 is a sectional view taking along line 8-8 in FIG. 4.

In this embodiment, the first and second restriction slots 26, 37 are substantively connected with each other to become an annular restriction slot 12 encircling the passage 11, as shown in FIG. 8, and the peripheral edge of the base 44 of the side button 40 is entirely located in the annular restriction slot 12. However, the first and second restriction slots 26, 37 can also not to be connected with each other in an annular manner. But the design of the annular restriction slot 12 provided in this embodiment can make the side button 40 be installed in the first and second shells 20 and 30 more firmly and more sufficiently water resistant.

Figure 9:
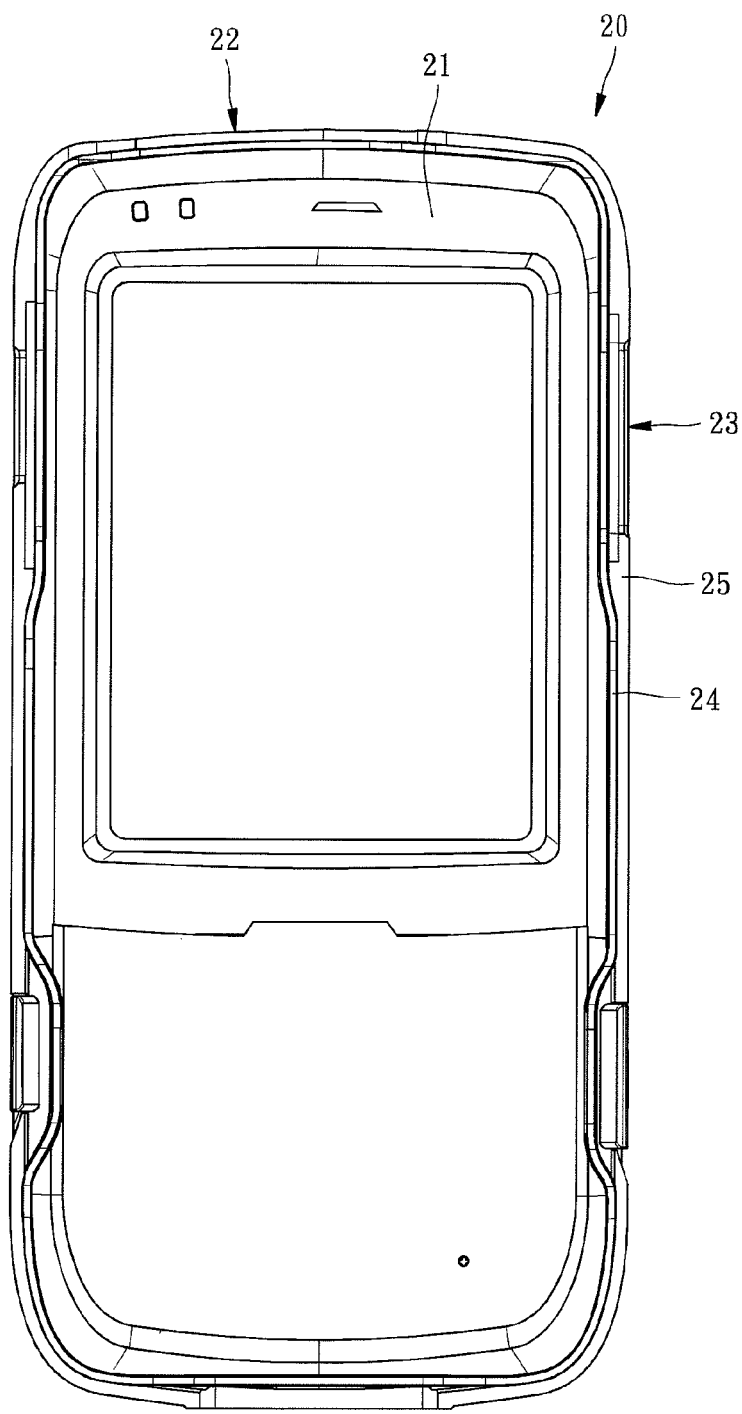
FIG. 9 is a planar view of the first shell of the electronic device case provided by the preferred embodiment of the present invention.
Figure 10:
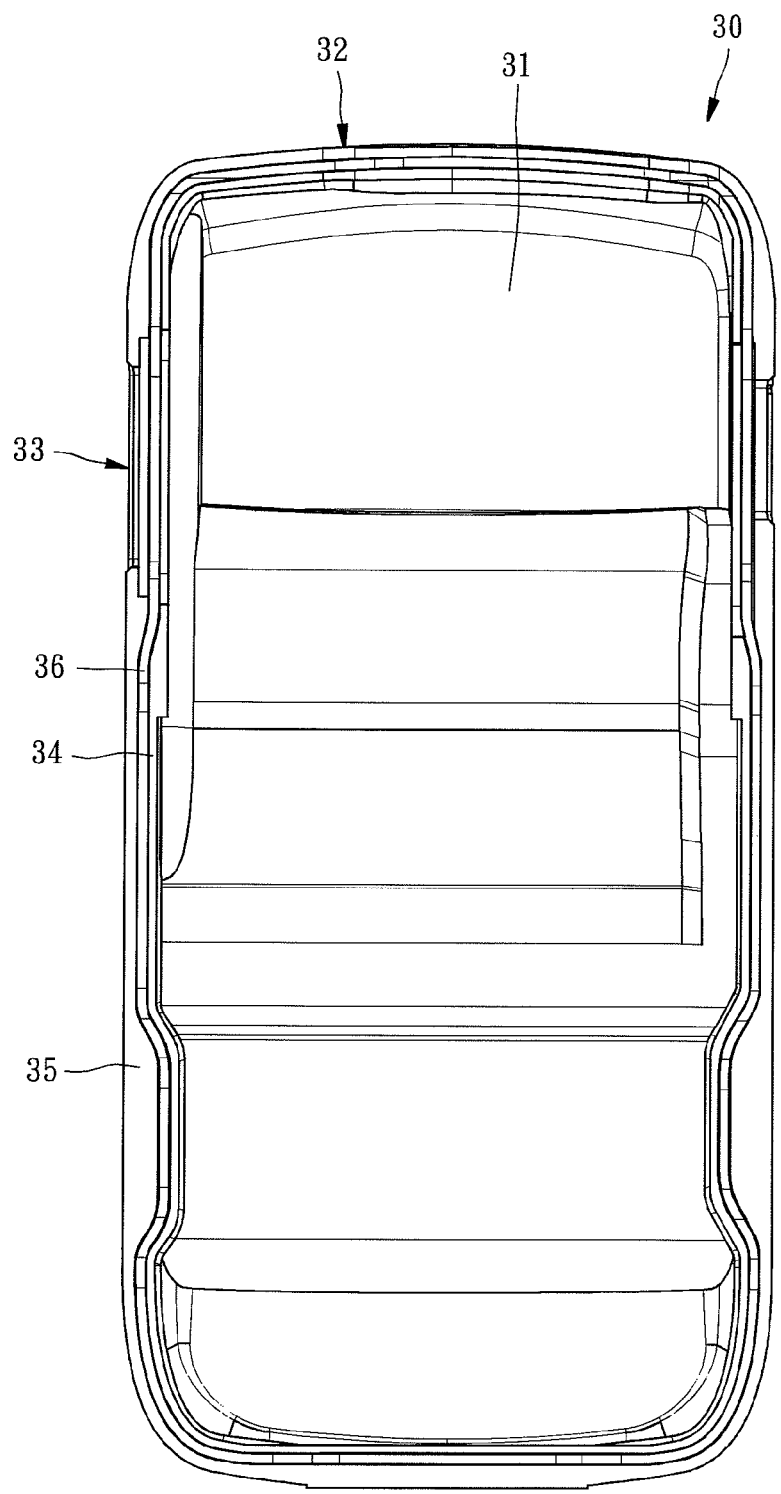
FIG. 10 is a planar view of the second shell of the electronic device case provided by the preferred embodiment of the present invention.

Referring to FIGS. 9-10, in this embodiment, the inner sheet 24 of the first shell 20 extends from the installment portion 23 to other portion of the peripheral side plate 22 and encircling the main plate 21; the outer sheet 35 and the inner sheet 34 of the second shell 30 both extend from the installment portion 33 to other portion of the peripheral side plate 32 and encircling the main plate 31 so that the embedment groove 36 is also encircling the main plate 31. In this way, the peripheral side plates 22, 32 of the shells 20, 30 can be embedded with each other without a vacancy just by inserting the inner sheet 24 into the embedment groove 36. This means the features configured for engaging the installment portions 23, 33 are also served as the configuration for engaging the shells 20, 30. This design makes the case 10 more convenient to assemble.

Furthermore, in this embodiment, the inner sheet 34 of the second shell 30 has a recess 342 at the installment portion 33, as shown in FIG. 5, which makes the part of the inner sheet 34 at the installment portion 33 extend less length from the main plate 31 than other part of the inner sheet 34 located beyond the installation portion 33. In this way, the inner sheet 34 overlaps sufficient area of the first shell 20 without covering the passage 11, which enhances the structure strength of the base 10.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electronic device case comprising:
   a first shell and a second shell each provided with a main plate and a peripheral side plate encircling the main plate, the peripheral side plate of the first shell having an installment portion which has an outer sheet and an inner sheet embedded in the peripheral side plate of the second shell in such a way that a passage communicating an outside and an inside of the case, a first restriction slot extending from the passage toward the first shell, and a second restriction slot extending from the passage toward the second shell are formed by the installment portion of the first shell and the peripheral side plate of the second shell jointly; and
   a side button provided with a base having a thickness larger than or equal to widths of the first and second restriction slots, and a press portion protruding from the base, the side button being installed in the passage with the base embedded in the first and second restriction slots.

2. The electronic device case as claimed in claim 1, wherein the base of the side button is provided with a protruded water resistant ring which is embedded in the first and second restriction slots.

3. The electronic device case as claimed in claim 1, wherein the base of the side button comprises a base body and a reinforcement plate piled on the base body.

4. The electronic device case as claimed in claim 1, wherein the base of the side button comprises a base body and a reinforcement plate; the base body has an inner surface and an outer surface facing the inside and the outside of the case respectively and a water resistant ring protruding from the inner surface; the reinforcement plate is piled on the outer surface of the base body; the water resistant ring and the reinforcement plate are embedded in the first and second restriction slots.

5. The electronic device case as claimed in claim 1, wherein the first and second restriction slots are substantively connected with each other to become an annular restriction slot encircling the passage and a peripheral edge of the base of the side button is entirely located in the annular restriction slot.

6. The electronic device case as claimed in claim 1, wherein the first restriction slot is located between the outer sheet and the inner sheet; the outer sheet is provided with a recess for shaping the passage; the inner sheet is provided with a hole for shaping the passage; the peripheral side plate of the second shell has an installment portion for installing the side button therein; the installment portion of the periphery side plate of the second shell has an embedment groove into which the inner sheet of the first shell is inserted.

7. The electronic device case as claimed in claim 6, wherein the inner sheet of the first shell encircles the main plate of the first shell; the embedment groove of the second shell encircles the main plate of the second shell.

8. The electronic device case as claimed in claim 6, wherein the installment portion of the peripheral side plate of the second shell has an outer sheet and an inner sheet; the outer sheet of the second shell is provided with an outer recess for shaping the passage, and an inner recess for shaping the second restriction slot; the outer recess and the inner recess are connected with each other to become ladder-shaped; the embedment groove of the second shell is located between the outer sheet and the inner sheet of the second shell; the embedment groove and the inner recess of the second shell are connected with each other to become ladder-shaped.

9. The electronic device case as claimed in claim 8, wherein the inner sheet of the first shell encircles the main plate of the first shell; the outer sheet and the inner sheet of the second shell encircle the main plate of the second shell so that the embedment groove encircles the main plate of the second shell.

10. The electronic device case as claimed in claim 9, wherein the inner sheet of the second shell has a recess at the installment portion of the periphery side plate of the second shell.

* * * * *